(12) United States Patent
Kim et al.

(10) Patent No.: US 8,525,945 B2
(45) Date of Patent: Sep. 3, 2013

(54) DISPLAY PANEL INCLUDING STATIC ELECTRICITY DISSIPATION MECHANISMS

(75) Inventors: Yu-Jin Kim, Cheonan-si (KR); Beom-Jun Kim, Seoul (KR); Sung-Man Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 842 days.

(21) Appl. No.: 12/547,840

(22) Filed: Aug. 26, 2009

(65) Prior Publication Data

US 2010/0238368 A1    Sep. 23, 2010

(30) Foreign Application Priority Data

Mar. 23, 2009  (KR) .............................. 2009-0024299

(51) Int. Cl.
*G02F 1/1333*    (2006.01)
(52) U.S. Cl.
USPC ............................................ 349/40; 349/54
(58) Field of Classification Search
USPC ............................................. 349/54, 192, 40
See application file for complete search history.

(56) References Cited

U.S. PATENT DOCUMENTS

| 6,690,433 B2 * | 2/2004 | Yoo et al. .................... 349/40 |
| 7,297,979 B2 * | 11/2007 | Lim et al. .................... 257/59 |
| 2003/0156231 A1 * | 8/2003 | Tsukao et al. ................ 349/43 |

FOREIGN PATENT DOCUMENTS

| JP | 2000-338514 A | 12/2000 |
| JP | 2005-049555 A | 2/2005 |
| KR | 1020080046891 A | 5/2008 |

* cited by examiner

*Primary Examiner* — Edward Glick
*Assistant Examiner* — David Chung
(74) *Attorney, Agent, or Firm* — Cantor Colburn LLP (57) ABSTRACT

A display panel includes; a lower substrate including a display area which includes a pixel and a peripheral area surrounding the display area, the peripheral area including a first peripheral area, a second peripheral area, a third peripheral area and a fourth peripheral area, the lower substrate including; a signal line electrically connected to the pixel, an electrostatic control pattern disposed in the first peripheral area and which provides an electrostatic dissipation path, and a repair line disposed between the display area and the electrostatic control pattern and which is vertically aligned with the signal line, an upper substrate facing the lower substrate and a liquid crystal layer disposed between the lower substrate and the upper substrate.

18 Claims, 7 Drawing Sheets

DISPLAY PANEL INCLUDING STATIC ELECTRICITY DISSIPATION MECHANISMS

This application claims priority to Korean Patent Application No. 2009-24299, filed on Mar. 23, 2009, and all the benefits accruing therefrom under 35 U.S.C. §119, the content of which in its entirety is herein incorporated by reference.

BACKGROUND OF THE INVENTION

1. Field of the Invention

Exemplary embodiments of the present invention relate to a display panel. More particularly, exemplary embodiments of the present invention relate to a display panel capable of preventing static electricity from being generated, especially during the manufacturing thereof.

2. Description of the Related Art

A liquid crystal display ("LCD") panel is a type of flat panel display. The typical LCD panel includes an array substrate having a plurality of pixels formed thereon, an opposite substrate facing the array substrate and a liquid crystal layer interposed between the array substrate and the opposite substrate.

During a typical manufacturing process of the LCD panel, various tests are performed to check whether or not a pixel of the LCD panel is normally operated.

To perform the tests, various wirings are formed in peripheral areas of the LCD panel. For example, a repair line for repairing the pixel, a plurality of pads for applying signals, a plurality of circuit wirings for connecting to the pads and elements formed on the LCD panel, and an electrostatic prevention line which surrounds an area of the LCD panel and the circuit wirings may be formed in peripheral areas of the LCD panel.

Since an interval distance between wirings is narrowed in an LCD product having high space-saving efficiency such as a laptop computer, a monitor, etc., static electricity may flow into the display panel area during a manufacturing process thereof. The static electricity may induce unwanted line defects of a pixel formed on the LCD panel.

BRIEF SUMMARY OF THE INVENTION

Exemplary embodiments of the present invention provide a display panel capable of preventing damage due to static electricity by controlling the flow of the static electricity and harmlessly disbursing the static electricity.

According to an exemplary embodiment of the present invention, a display panel includes; a lower substrate including a display area which includes a pixel and a peripheral area surrounding the display area, the peripheral area including a first peripheral area, a second peripheral area, a third peripheral area and a fourth peripheral area, the lower substrate including; a signal line electrically connected to the pixel, an electrostatic control pattern disposed in the first peripheral area and which provides an electrostatic dissipation path, and a repair line disposed between the display area and the electrostatic control pattern and which is vertically aligned with the signal line, an upper substrate facing the lower substrate and a liquid crystal layer disposed between the lower substrate and the upper substrate.

In an exemplary embodiment of the present invention, the lower substrate may further include a gate driving part disposed between a portion of the repair line in the second peripheral area and the display area, wherein the gate driving part provides the pixel with a gate signal, first pads which receive a gate driving signal to generate the gate signal, second pads which receive a data signal transmitted to the pixel and a third pad which receives a common signal transmitted to the signal line.

According to an exemplary embodiment of the present invention, an array substrate includes a base substrate including a display area which includes a pixel and a peripheral area surrounding the display area, a signal line electrically connected to the pixel, an electrostatic control pattern disposed in the peripheral area and which provides an electrostatic dissipation path, the electrostatic control pattern being vertically aligned with the signal line, and a repair line disposed between the display area and the electrostatic control pattern and vertically aligned with the signal line.

According to an exemplary embodiment of the present invention, a liquid crystal display panel includes; a lower substrate which includes a display area which includes a pixel, a peripheral area surrounding the display area, the peripheral area including a first peripheral area, a second peripheral area, a third peripheral area and a fourth peripheral area, the lower substrate including; a signal line electrically connected to the pixel, an electrostatic control pattern disposed in the first peripheral area and which provides an electrostatic dissipation path, a repair line disposed between the display area and the electrostatic control pattern and substantially vertically aligned with the signal line, and an electrostatic prevention line surrounding the first peripheral area, an upper substrate facing the lower substrate and a liquid crystal layer disposed between the lower substrate and the upper substrate.

According to exemplary embodiments of the present invention, damage to a pixel or wiring which is due to static electricity that is generated during a manufacturing process of an LCD panel may be prevented. Thus, the manufacturing yield of the LCD panel may be enhanced.

BRIEF DESCRIPTION OF THE DRAWINGS

The above and other aspects, features and advantages of the present invention will become more apparent by describing in detailed exemplary embodiments thereof with reference to the accompanying drawings, in which.

DETAILED DESCRIPTION OF THE INVENTION

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. Like reference numerals refer to like elements throughout.

It will be understood that when an element or layer is referred to as being "on," another element, it can be directly on the other element or intervening elements may be present therebetween. In contrast, when an element is referred to as being "directly on," "directly connected to" or "directly coupled to" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. For example, a region illustrated or described as flat may, typically, have rough and/or nonlinear features. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be explained in detail with reference to the accompanying drawings.

Exemplary Embodiment 1

Figure 1:
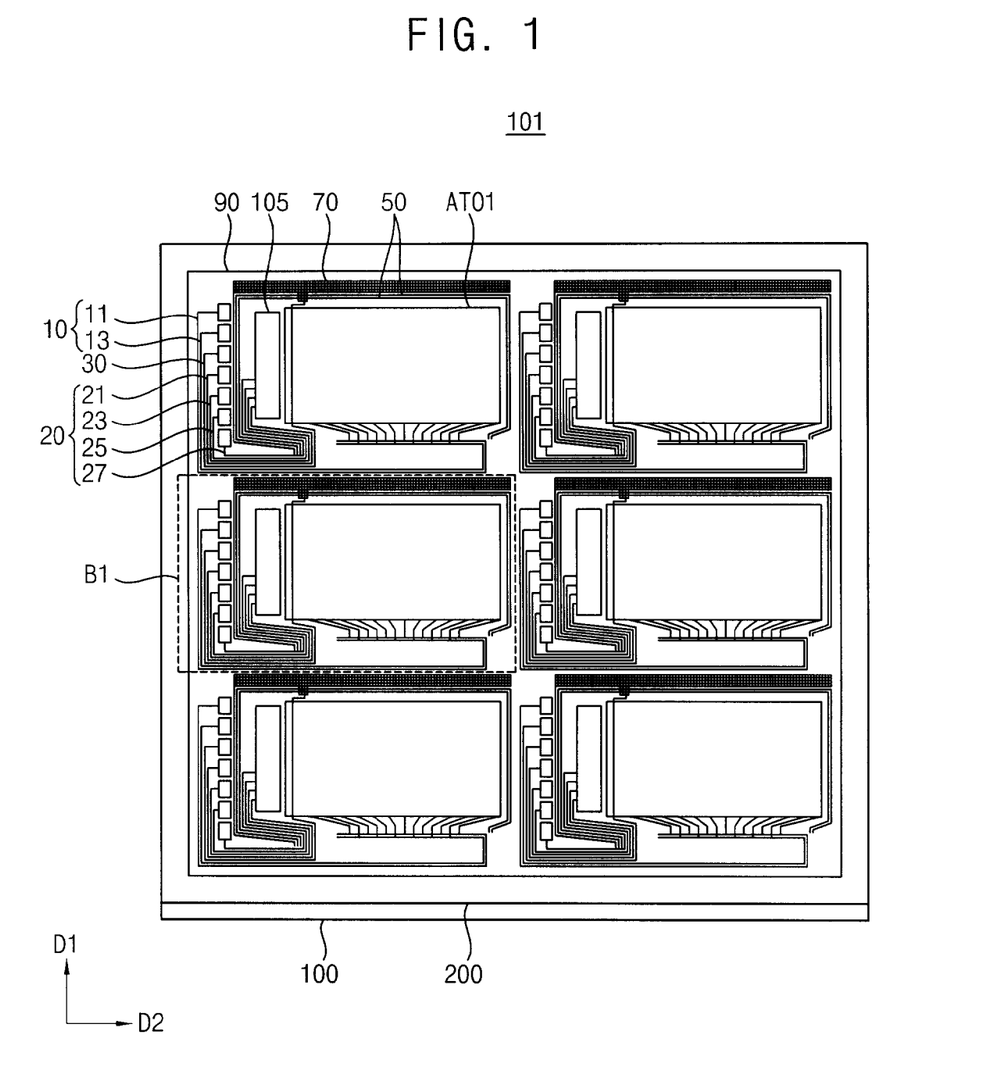
FIG. 1 is a top plan view illustrating an exemplary embodiment of a panel according to Exemplary Embodiment 1.
Figure 2:
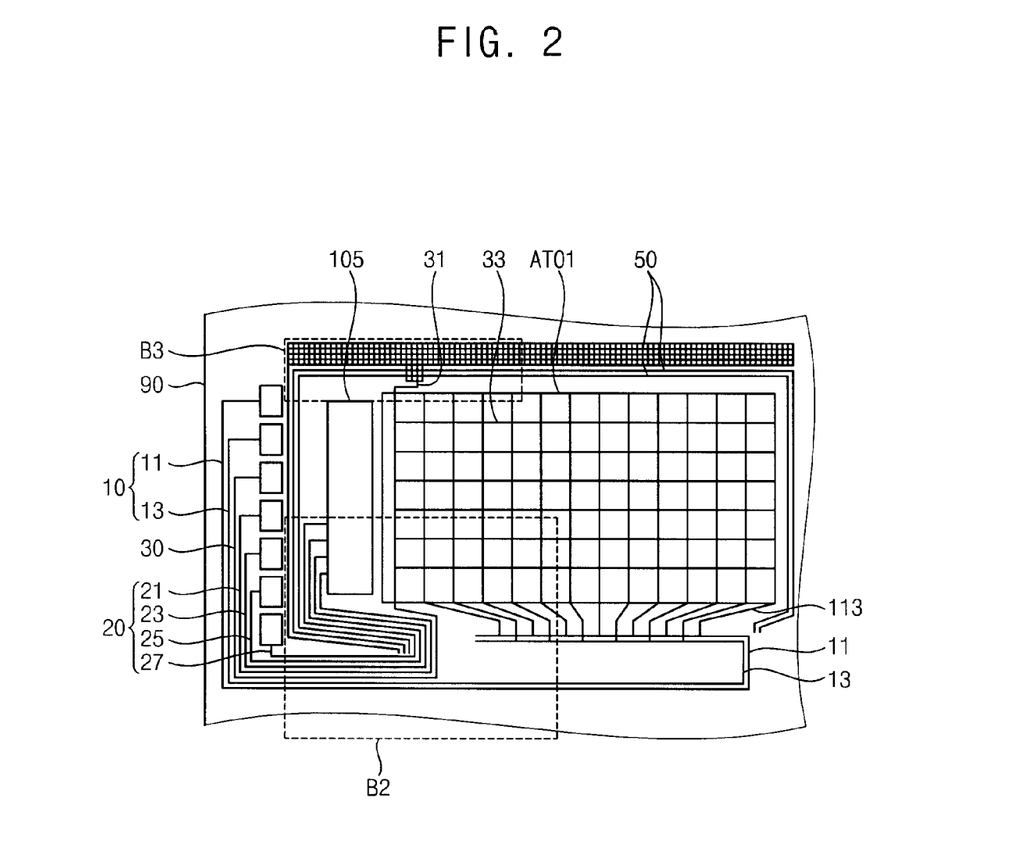
FIG. 2 is an enlarged view of a first area B1 of FIG. 1.

FIG. 1 is a top plan view illustrating an exemplary embodiment of a panel 101 according to Exemplary Embodiment 1. FIG. 2 is an enlarged view of a first area B1 of FIG. 1.

Referring to FIGS. 1 and 2, a panel 101 according to the present exemplary embodiment includes a lower substrate 100, an upper substrate 200 facing the lower substrate 100 and a liquid crystal layer interposed between the lower substrate 100 and the upper substrate 200.

A display area AT01 is formed on the lower substrate 100. In the present exemplary embodiment, the display area AT01 has a rectangular shape in which a horizontal direction D2 is longer than a vertical direction D1. A plurality of gate lines 111 and a plurality of data lines 113 are formed in the display area AT01. The gate lines 111 are formed along the horizontal direction D2, and the data lines 113 are extended in the direction D1 to be substantially perpendicular to the gate lines.

A plurality of peripheral areas which surround the display area AT01 is formed on the lower substrate 100. The peripheral areas include a first peripheral area contacting an upper side of the display area AT01, a second peripheral area contacting a left side of the display area AT01, a third peripheral area contacting a lower side of the display area AT01 and a fourth peripheral area contacting a right side of the display area AT01. The lower substrate includes a pixel, signal lines 31 and 33, an electrostatic control pattern 70, a repair line 50 and an electrostatic prevention line 90.

The upper substrate 200 may include a common electrode (not shown) facing the pixel electrode.

Figure 3:
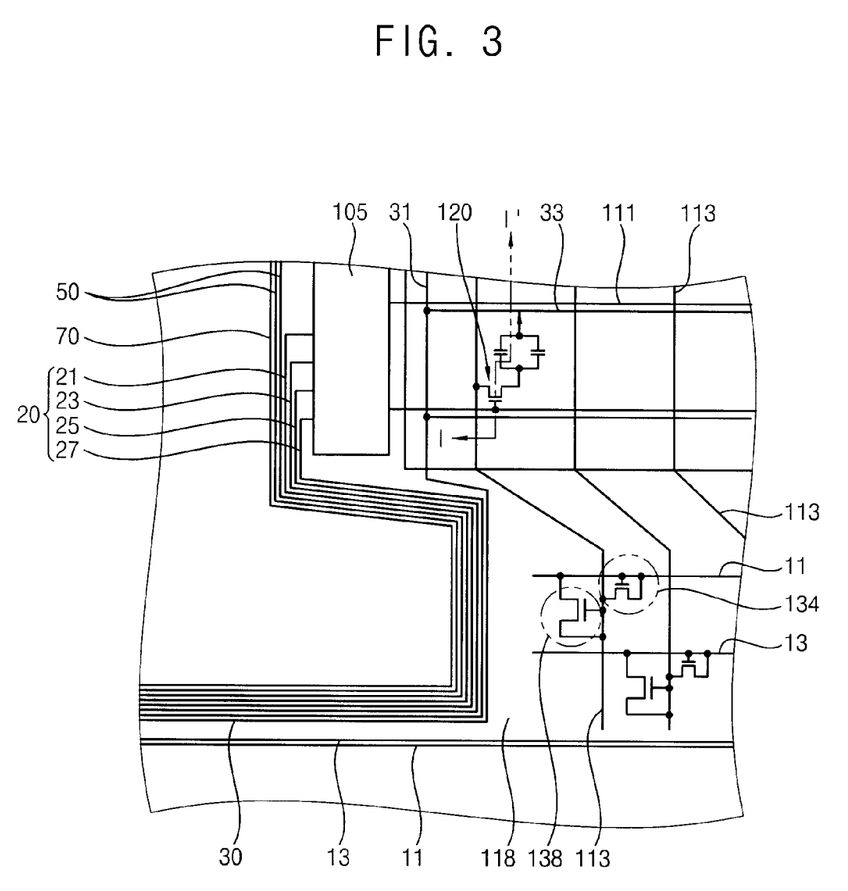
FIG. 3 is an enlarged view of a second area B2 of FIG. 2.

FIG. 3 is an enlarged view of a second area B2 of FIG. 2.

Referring to FIGS. 2 and 3, in an exemplary embodiment, the pixel may include a switching element 120 connected to the gate line 111 and the data line 113, and a pixel electrode connected to the switching element 120.

The signal lines 31 and 33 and the pixel electrode may form a storage capacitor. The signal line 31 and 33 are extended toward the first peripheral area as shown in FIG. 2. In the present exemplary embodiment, the signal lines 31 and 33 are separated from the gate lines 111 and the data lines 113.

The gate line 111 is connected to a gate electrode of the switching element 120. The gate line 111 is extended toward the second peripheral area.

In an exemplary embodiment, the lower substrate 100 may include a gate driving part 105. In such an exemplary embodiment, the gate driving part 105 may be integratedly formed on the lower substrate 100. The gate driving part 105 applies a gate signal to a gate electrode along the gate line 111 in response to a gate driving signal delivered from an external device (not shown). In an exemplary embodiment, the gate driving part 105 is formed in the second peripheral area to be connected to the gate line 111.

The data line 113 is connected to a source electrode of the switching element 120. In an exemplary embodiment, the data line 113 is extended toward the third peripheral area. When the gate electrode is turned on, a data signal transmitted from an external device to the source electrode is applied to the pixel electrode through a drain electrode of the switching element 120. In an exemplary embodiment, the data signal may be uniformly maintained by a storage capacitor formed between the signal lines 31 and 33 and the pixel electrode during one frame.

Figure 4:
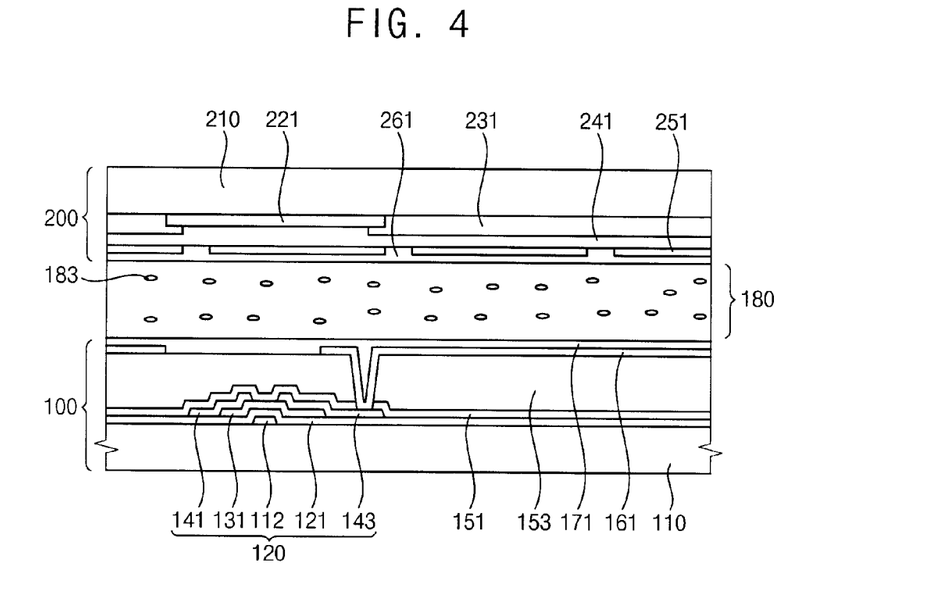
FIG. 4 is a cross-sectional view taken along line I-I' of the exemplary embodiment of a panel of FIG. 3.

FIG. 4 is a cross-sectional view taken along line I-I' of the panel 101 of FIG. 3.

Referring to FIGS. 3 and 4, the switching element 120 includes a gate insulation layer 121 and a semiconductor pattern 131. The gate insulation layer 121 is formed on a lower base substrate 110 having the gate line 111 is formed thereon. The semiconductor pattern 131 is formed on the gate insulation layer 121 corresponding to the gate electrode 112 in an island shape. The source electrode 141 and drain electrode 143 are spaced apart from each other on the semiconductor pattern 131.

The lower substrate 100 may further include a passivation film 151, an organic insulation layer 153 and a first alignment layer 171. The passivation film 151 is formed on the switching element 120. The organic insulation layer 153 is formed on the passivation film 151. Exemplary embodiments include configurations wherein the organic insulation layer 153 or the passivation film 151 are omitted.

A pixel electrode 161 is formed on the organic insulation layer 153 corresponding to a pixel area. The first alignment layer 171 is formed on the pixel electrode 161.

The upper substrate 200 may include an upper base substrate 210, a light-blocking pattern 221 which blocks the switching element 120 and the signal lines 31 and 33, a color filter 231 formed in correspondence with the pixel electrode 161, an overcoating layer 241 which covers the color filter 231, a common electrode 251 formed on the overcoating layer 241 and a second alignment layer 261 formed on the common electrode 251. Alternative exemplary embodiments include configurations wherein the color filter 231 may be formed on the lower substrate 100.

The liquid crystal layer 180 is interposed between the first alignment layer 171 and the second alignment layer 261. In the present exemplary embodiment, in order to enhance a viewing angle, a viewing angle enhancing technology may be applied to the display panel. For example, exemplary embodiments include configurations wherein in order to enhance a viewing angle of the display panel, a technology in which the pixel area is divided into a plurality of domains having different alignment directions of liquid crystal 181 may be applied to the display panel. Alternative exemplary embodiments of viewing angle enhancement may be alternatively or additional included.

To obtain the plurality of domains, a plurality of micro-slits having different formation directions from each other may be formed in the pixel electrode 161. Alternative exemplary embodiments include configurations wherein the liquid crystal layer 180 may be driven in a patterned vertical alignment ("PVA") mode, and a slit pattern may be formed in the pixel electrode 161 and the common electrode 251.

Figure 5:
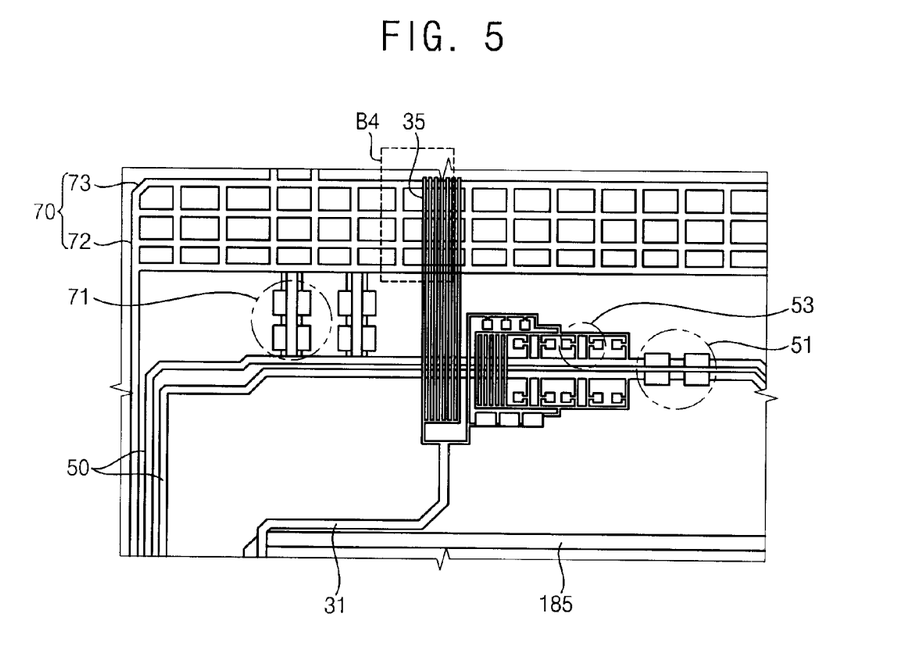
FIG. 5 is an enlarged view of a third area B3 of FIG. 2.

FIG. 5 is an enlarged view of a third area B3 of FIG. 2.

Referring to FIGS. 2 and 5, the repair line 50 is formed adjacent to the display area AT01, and is formed in the first peripheral area, the second peripheral area and the fourth peripheral area along sides of the display area AT01. In an exemplary embodiment, the repair line 50 may include two independent wirings. The repair line 50 is formed in an area to the outside of the gate driving part 105 in the second peripheral area. The repair line 50 may be used to repair an error of the data line 113. For example, in an exemplary embodiment wherein the data line 113 is opened, the repair line 50 is connected to an end portion of the data line 113 that is opened to apply a data signal to a pixel.

The electrostatic control pattern 70 is formed in an area to the outside of the repair line 50 and substantially parallel to the repair line 50 to provide an electrostatic dissipation path. In the present exemplary embodiment, the electrostatic control pattern 70 is formed in the first peripheral area and the second peripheral area. Moreover, exemplary embodiments include configurations wherein the electrostatic control pattern 70 may be extended to the fourth peripheral area. The electrostatic control pattern 70 is formed in the first peripheral area in a first honeycomb shape pattern 73, and is formed in the second peripheral area in a line shape substantially parallel to the repair line 50.

Figure 6:
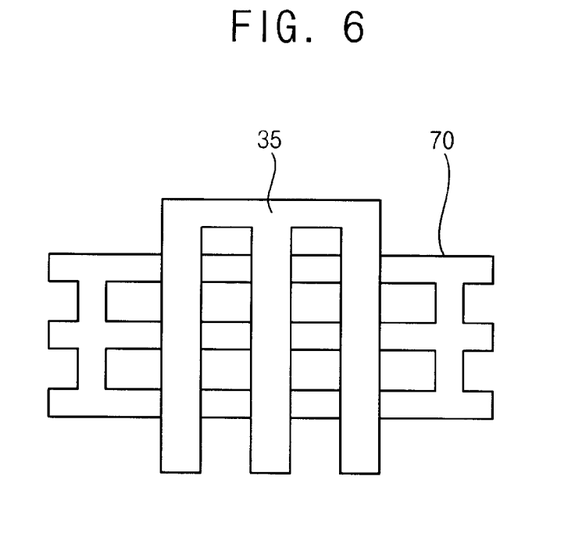
FIG. 6 is an enlarged view of a fourth area B4 of FIG. 5.

FIG. 6 is an enlarged view of a fourth area B4 of FIG. 5.

Referring to FIGS. 2, 5 and 6, the electrostatic control pattern 70 may be formed from the same metal layer as the gate line 111. In such an exemplary embodiment, a material of the electrostatic control pattern 70 may be the same as that of the gate line 111. The signal lines 31 and 33 may be formed from the same metal layer as the gate line 111 on the display area AT01. The lower substrate 100 may further include an insulation layer in the peripheral area, which is formed on the repair line 50 and the electrostatic control pattern 70.

Moreover, alternative exemplary embodiments include configurations wherein the electrostatic control pattern 70 may be formed from the same metal layer as the data line 113. In such an exemplary embodiment, a material of the electrostatic control pattern 70 may be the same as that of the data line 113.

The signal lines 31 and 33 are extended in the first peripheral area to be formed on the insulation layer. End portions of the signal lines 31 and 33 overlap the repair line 50 and the electrostatic control pattern 70. In the present exemplary embodiment, the end portions of the signal lines 31 and 33 may include a second honeycomb shape pattern 35. Thus, the first honeycomb shape pattern 73 and the second honeycomb shape pattern 35 are overlapped, e.g., vertically aligned, with each other.

In the present exemplary embodiment, the electrostatic control pattern 70 provides a diffusion path for static electricity flowing through the repair line 50 to remove static electricity. That is, the electrostatic control pattern 70 may be defined as an electrostatic dissipation path. In addition, the electrostatic control pattern 70 prevents static electricity from flowing to a conductive substance such as the data line 113 outside of the electrostatic control pattern 70.

The static electricity is diffused along the first honeycomb shape pattern 73, and thus electric energy may be dissipated so that the energy level may be decreased. Moreover, when a large amount of static electricity is generated, current flows are generated from the repair line 50 and the first honeycomb shape pattern 73 to the second honeycomb shape pattern 35 so that static electricity may be diffused to the signal lines 31 and 33. In the present exemplary embodiment, the signal lines 31 and 33 have a sufficient area on the display area AT01, so that the static electricity may be effectively dispersed. Thus, damage due to the static electricity or electrical shocks may be prevented from being generated at the data line 113 or the pixel.

Referring again to FIGS. 2 and 3, the lower substrate 100 may further include a first test line 20, a second test line 10 and a third test line 30. The first test line 20 may include a line which receives a voltage from first pads including a start voltage pad (Stvp) 21, a line which receives a first clock signal (Ckv) 23, a line which receives a second clock signal (Ck) 25 and a line which receives a ground voltage (Vss) 27. The second test line 10 may include second pads including two detecting lines 11 and 13. The third test line 30 may include a third pad receiving a common voltage (Vcst) 30.

Before or after the panel 101 is cut to manufacture a display panel, a test for the pixel and so on may be performed, e.g., a quality control check may be performed. The first to third pads from the top of the display down along a direction substantially opposite to D1 are used to apply signals for the test to the pixel and the signal lines 31 and 33. For example, a probe contacts the first to third pads to apply a signal to the signal lines 31 and 33.

In the present exemplary embodiment, the first, second and third pads are disposed between the electrostatic prevention line 90 and the electrostatic control pattern 70 of a line shape in the second peripheral area. In the present exemplary embodiment, the second pads connected to second detecting lines 11 and 13, the third pad connected to third test line 30 and the first pads connected to lines 21, 23, 25 and 27 are sequentially disposed along the direction substantially opposite to D1 when viewed from a top plan view.

The second test line 20 connects to the first pads 21, 23, 25 and 27 and the gate driving part 105 as shown in FIG. 2. When a gate driving signal is applied to the first pads 21, 23, 25 and 27 from an external device, the gate driving part 105 may output the gate signal to the gate line 111.

The second test line 10 is extended from the two second detecting lines 11 and 13 to the third peripheral area. The second test line 10 is disposed on an area to the outside of the first test line 20, and is disposed close to another electrostatic control pattern 70 formed in the first peripheral area of the adjacent display area AT01 as shown in FIG. 1.

Exemplary embodiments include configurations wherein the lower substrate 100 may further include a data shorting diode 134 and a data protection diode 138 as shown in FIG. 3. The data shorting and protecting diodes 134 and 138 are parallelly and electrically connected to the second test line 10 by the data shorting diode 134, respectively. Thus, when a test signal, for example the data signal, is applied to the second test line 10, the data signal may be applied to the source electrode 141 through the data line 113 by the data shorting diode 134. The data signal applied to the second test line 10 is respectively applied to the data shorting diode 134 connected to the data line 113 at the same time, so that the same data signal may be applied to a plurality of data lines 113 at the same time.

When static electricity is applied to the data line 113 from the exterior, the static electricity is applied to a data shorting line 118 by the data protection diode 138. Thus, the static electricity is dispersed to a plurality of the data lines 113 by the data shorting line 118. As a result, damage may be prevented from being generated at the data line 113 and the pixel.

A common signal is applied to the third pad 30. In an exemplary embodiment, the common signal may be a signal substantially identical to a common voltage applied to the common electrode of the upper substrate. The third test line 30 is extended between the first test line 20 and the second test line 10 from the third pad 30, and is bent in an area adjacent to a lower side of the gate driving part 105 to be connected to the signal lines 31 and 33.

In this exemplary embodiment, static electricity flowing in from the exterior may be firstly removed by the electrostatic prevention line 90, and static electricity flowing into the interior via the electrostatic prevention line 90 may be diffused along the second test line 10 and the repair line 50 that are disposed at an outermost portion of the peripheral area. As mentioned above, the second test line 10 may be extended to the third peripheral area adjacent to the electrostatic control pattern 70 formed in a first peripheral area of the display area AT01. Thus, static electricity diffused along the second test line 10 may flow into the second honeycomb shape pattern 35 of the electrostatic control pattern 70. A portion of static electricity delivered along the repair line 50 and the second test line 10 may be removed at the first honeycomb shape pattern 73, and the remaining portion of static electricity may be diffused to the signal lines 31 and 33 of the display area AT01 through the second honeycomb shape pattern 35 of the signal lines 31 and 33, as mentioned above, so that the static electricity may be removed.

In order to increase the efficacy of damage prevention due to static electricity, a voltage level of the static electricity may be decreased before the static electricity flows into the signal lines 31 and 33. To decrease the voltage level of the static electricity, as shown in FIG. 5, the lower substrate 100 may further include a second diode 71, a third diode 53 and a fourth diode 51.

Input and output terminals of the second diode 71 are connected to the repair line 50 and the first honeycomb shape pattern 73. Input and output terminals of the third diode 53 are connected to the repair line 50 and end portions of the signal lines 31 and 33 via the second honeycomb 35. Thus, due to directional properties of the second diode 71, static electricity flows from the repair line 50 to the first honeycomb shape pattern 73, and static electricity may be prevented from directly flowing from the repair line 50 into the display area AT01. Moreover, due to directional properties of the third diode 53, static electricity flows from the repair line 50 to the signal lines 31 and 33, and static electricity may be prevented from being delivered to another circuit wiring of a peripheral area.

Input and output terminals of the fourth diode 51 are connected to the repair line 50. Thus, static electricity flowing through the repair line 50 has directional properties, so that the static electricity may be prevented from flowing toward a peripheral portion.

A test may also be performed before or after the panel 101 is cut to include the display area AT01 and a portion of a peripheral area. The peripheral area after cutting may include the first to third pads, and the first to third test lines 20, 10 and 30 may be disposed at corner portions of the resulting display panel. The resulting display panel may include the repair line 50 and the electrostatic control pattern 70.

According to the present exemplary embodiment, even though an interval distance between display areas AT01 of the display panel is narrow, damage due to static electricity may be prevented.

Exemplary Embodiment 2

Figure 7:
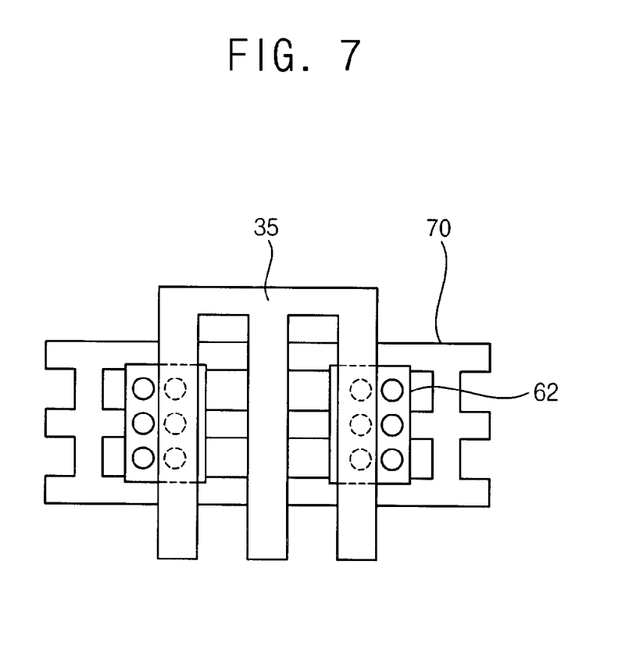
FIG. 7 is an enlarged view of a fourth area B4 of an exemplary embodiment of a panel according to Exemplary Embodiment 2.

FIG. 7 is an enlarged view of a fourth area of a second exemplary embodiment of a panel according to Exemplary Embodiment 2.

Referring to FIGS. 2, 5 and 7, the signal lines 31 and 33 are overlapped with, e.g., vertically aligned with, the electrostatic control pattern 70 with an insulation layer 62 interposed therebetween. The insulation layer 62 has at least one contact hole formed therethrough, which exposes a portion of the first honeycomb shape pattern 73. In the present exemplary embodiment the insulation layer 62 includes six contact holes formed therethrough. In an exemplary embodiment, a conductive substance is formed in the contact hole, so that the signal lines 31 and 33 are electrically connected to the electrostatic control pattern 70. Exemplary embodiments of a material of the conductive substance may be substantially identical to that of the pixel electrode. When static electricity stored in the electrostatic control pattern 70 is diffused along the first honeycomb shape pattern 73, electrical energy may be dissipated so that the energy level may be decreased. Thus, the decreased static electricity may be easily diffused to the second honeycomb shape pattern 35 and the signal lines 31 and 33 through the conductive substance.

Exemplary Embodiment 3

Figure 8:
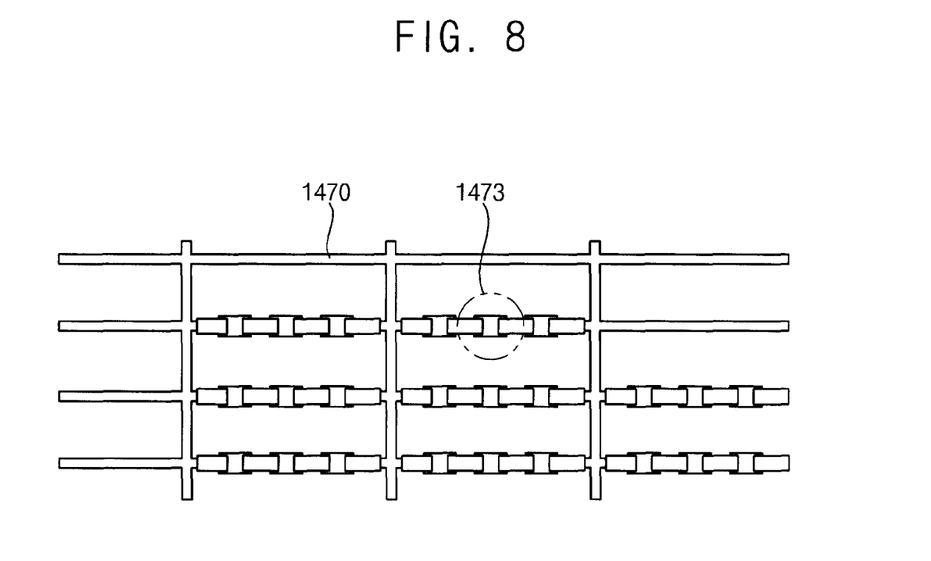
FIG. 8 is an enlarged view of a fourth area B4 of an exemplary embodiment of a panel according to Exemplary Embodiment 3.

FIG. 8 is an enlarged view of a fourth area of an exemplary embodiment of a panel according to Exemplary Embodiment 3.

Referring to FIGS. 2, 5 and 8, a panel of the present exemplary embodiment further includes an electrostatic diode 1473 within a first honeycomb shape pattern 1470. The electrostatic diode 1473 may be further formed in the second honeycomb shape.

In the present exemplary embodiment, input and output terminals of the electrostatic diode 1473 are connected to the first honeycomb shape pattern 1470. Thus, the static electricity of the first honeycomb shape pattern 1470 passes through the electrostatic diode 1473, so that the energy level of the static electricity may be decreased.

Exemplary Embodiment 4

Figure 9:
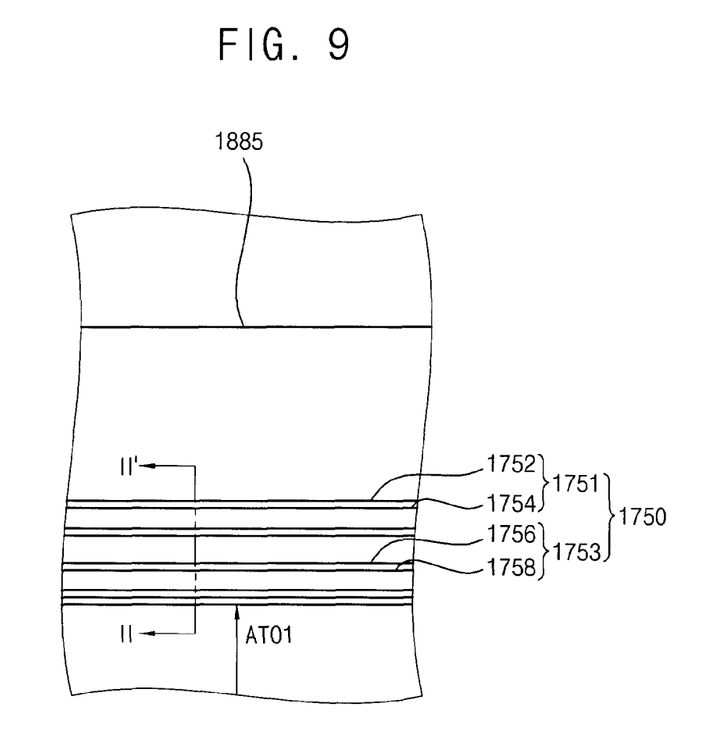
FIG. 9 is a top plan view illustrating a repair line of an exemplary embodiment of a panel according to Exemplary Embodiment 4.

FIG. 9 is a top plan view illustrating a repair line of an exemplary embodiment of a panel according to Exemplary Embodiment 4.

Referring to FIG. 9, in a display panel of the present exemplary embodiment, a repair line 1750 is covered by a sealing member 1885, the repair line 1750 forming a boundary of the display area AT01.

In the present exemplary embodiment, the sealing member 1885 is disposed between an array substrate and an opposite substrate, e.g., a lower substrate 100 and an upper substrate 200, to bond a liquid crystal layer within the array substrate and the opposite substrate. When an interval distance between the display areas AT01 is narrow so as to enhance the productivity of a display panel 101, areas in which wirings are disposed in a region peripheral to the display area AT01 are narrowed. In this exemplary embodiment, the position of the repair line 1750 is changed from a region peripheral to the display area AT01 to an area corresponding to the sealing member 1885. Accordingly, an interval between the display areas AT01 may be decreased in accordance with the present invention.

Figure 10:
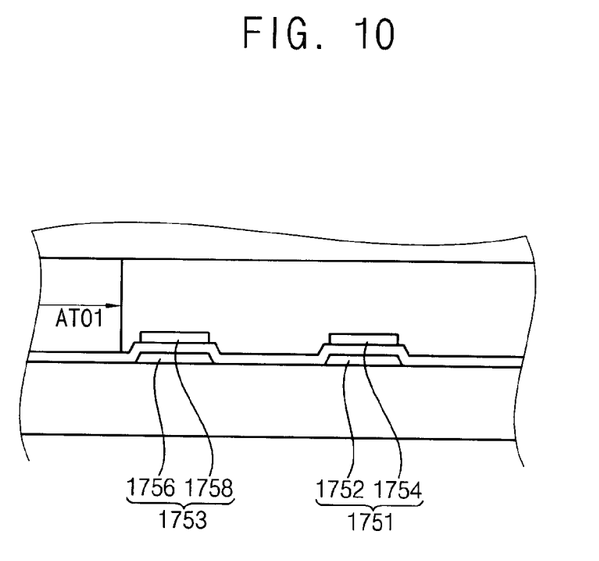
FIG. 10 is a cross-sectional view taken along line II-II' of the exemplary embodiment of a panel of FIG. 9.
Figure 11:
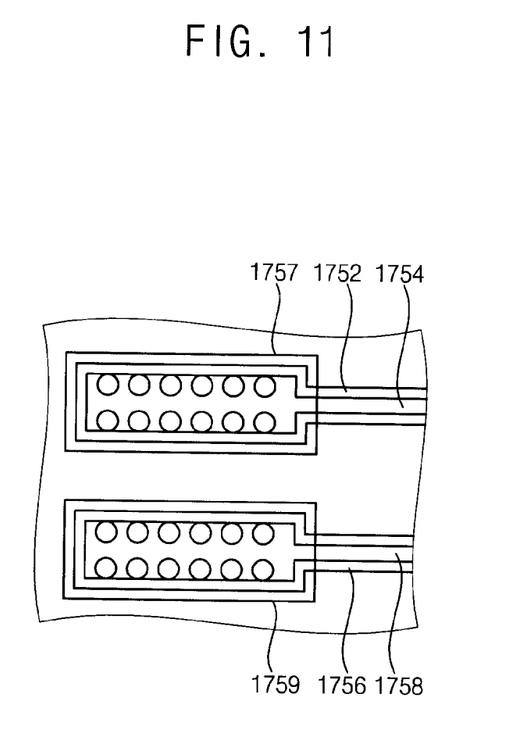
FIG. 11 is a top plan view illustrating an exemplary embodiment of a pad formed at an end portion of a repair line.

FIG. 10 is a cross-sectional view taken along line II-II' of the exemplary embodiment of a display panel of FIG. 9. FIG. 11 is a top plan view illustrating a pad formed at an end portion of a repair line.

Referring to FIGS. 9, 10 and 11, the repair line 1750 includes independent lines 1751 and 1753 that are spaced apart from each other on the same layer, e.g., the same height above the underlying substrate. Each of the independent lines 1751 and 1753 includes first sub-lines 1752 and 1754 that are formed in a double layer and second sub-lines 1756 and 1758 that are formed in a double layer. The first sub-lines 1752 and 1754 are electrically connected to the second sub-lines 1756 and 1758 through pads 1757 and 1759, respectively, as shown in FIG. 11.

The sealing member 1885 and the repair line 1750 may delay a signal applied to the repair line 1750. In this exemplary embodiment, even though a width of the sealing member 1885 is narrow, since the first sub-lines 1752 and 1754 and the second sub-lines 1756 and 1758 are arranged in a double layer, respectively electrical resistance may be decreased, so that the signal delay due to the sealing member 1885 may be prevented.

According to the exemplary embodiments of a display panel according to the present invention, damage to a pixel or wiring due to static electricity that is generated during a manufacturing process of an LCD panel may be prevented. Thus, the manufacturing yield of the LCD panel 101 may be enhanced. Therefore, the present invention may be applied to a manufacturing process of a display panel.

The foregoing is illustrative of the present invention and is not to be construed as limiting thereof Although a few exemplary embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other exemplary embodiments, are intended to be included within the scope of the appended claims.

What is claimed is:

1. A display panel comprising:
    a lower substrate including a display area which includes a pixel, and a peripheral area surrounding the display area, the peripheral area including a first peripheral area, a second peripheral area, a third peripheral area and a fourth peripheral area, the lower substrate comprising:
    a signal line electrically connected to the pixel and separated from gate and data lines;
    an electrostatic control pattern disposed in the first peripheral area and which provides an electrostatic dissipation path; and
    a repair line disposed between the display area and the electrostatic control pattern and which is vertically aligned with the signal line;
    an upper substrate facing the lower substrate; and a liquid crystal layer disposed between the lower substrate and the upper substrate, wherein the lower substrate further comprises:
a gate driving part disposed between a portion of the repair line in the second peripheral area and the display area wherein the gate driving part provides the pixel with a gate signal;
first pads which receive a gate driving signal to generate the gate signal;
second pads which receive a data signal transmitted to the pixel; and
a third pad which receives a common signal transmitted to the signal line.

2. The display panel of claim 1, wherein the electrostatic control pattern is disposed in a first honeycomb shape pattern in the first peripheral area, and is extended in a line shape in a portion of the second peripheral area wherein the electrostatic control pattern is substantially parallel to the repair line.

3. The display panel of claim 2, wherein an end portion of the signal line extended in the first peripheral area is disposed in a second honeycomb shape pattern which is vertically aligned with the first honeycomb shape pattern.

4. The display panel of claim 3, further comprising an insulation layer disposed between the first honeycomb shape pattern and the second honeycomb shape pattern, wherein the first honeycomb shape pattern and the second honeycomb shape pattern are insulated from each other.

5. The display panel of claim 3, wherein the lower substrate further comprises:
an insulation layer disposed between the first honeycomb shape pattern and the second honeycomb shape pattern, the insulation layer having at least one contact hole which exposes a portion of the first honeycomb shape pattern therethrough; and
a conductive substance which electrically connects the first honeycomb shape pattern and the second honeycomb shape pattern through the at least one contact hole.

6. The display panel of claim 3, wherein the lower substrate further comprises a first diode which includes an input terminal and an output terminal that are respectively connected to the first honeycomb shape pattern and the second honeycomb shape pattern.

7. The display panel of claim 3, wherein the lower substrate further comprises a second diode which includes an input terminal and an output terminal that are respectively connected to the repair line and the first honeycomb shape pattern.

8. The display panel of claim 3, wherein the lower substrate further comprises a third diode which includes an input terminal and an output terminal that are respectively connected to the repair line and an end portion of the signal line.

9. The display panel of claim 3, wherein the lower substrate further comprises a fourth diode which includes an input terminal and an output terminal that are respectively connected to the first honeycomb shape pattern.

10. An array substrate comprising:
a base substrate comprising a display area which includes a pixel and a peripheral area surrounding the display area;
a signal line electrically connected to the pixel and separated from gate and data lines
an electrostatic control pattern disposed in the peripheral area and which provides an electrostatic dissipation path, the electrostatic control pattern being vertically aligned with the signal line;
a repair line disposed between the display area and the electrostatic control pattern and vertically aligned with the signal line;
an insulation layer disposed between the signal line and the electrostatic control pattern the insulation layer having at least one contact hole which exposes a portion of the electrostatic control pattern therethrough; and
a conductive substance which electrically connects the electrostatic control pattern and the signal line through the at least one contact hole.

11. A liquid crystal display panel comprising:
a lower substrate which includes a display area which includes a pixel, a peripheral area surrounding the display area, the peripheral area including a first peripheral area, a second peripheral area, a third peripheral area and a fourth peripheral area, the lower substrate comprising:
a signal line electrically connected to the pixel;
an electrostatic control pattern disposed in the first peripheral area and which provides an electrostatic dissipation path;
a repair line disposed between the display area and the electrostatic control pattern and substantially vertically aligned with the signal line; and
an electrostatic prevention line surrounding the first peripheral area;
an upper substrate facing the lower substrate; and
a liquid crystal layer disposed between the lower substrate and the upper substrate.

12. The liquid crystal display panel of claim 11, wherein the lower substrate further comprises:
a gate driving part disposed between a portion of the repair line in the second peripheral area and the display area and which provides the pixel with a gate signal;
first pads which receive a gate driving signal which generates the gate signal;
second pads which receive a data signal delivered to the pixel; and
a third pad which receives a common signal delivered to the signal line.

13. The liquid crystal display panel of claim 12, wherein the electrostatic control pattern is disposed in a first honeycomb shape pattern in the first peripheral area, and is extended in a line shape in the second peripheral area substantially parallel to the repair line.

14. The liquid crystal display panel of claim 13, wherein an end portion of the signal line extended in the first peripheral area is disposed in a second honeycomb shape pattern substantially vertically aligned with the first honeycomb shape pattern.

15. The liquid crystal display panel of claim 14, further comprising an insulation layer disposed between the first honeycomb shape pattern and the second honeycomb shape pattern, wherein the first honeycomb shape pattern and the second honeycomb shape pattern are insulated from each other.

16. The liquid crystal display panel of claim 11, wherein the lower substrate further comprises:
an insulation layer disposed between the first honeycomb shape pattern and the second honeycomb shape pattern, the insulation layer having at least one contact hole which exposes a portion of the first honeycomb shape pattern therethrough; and
a conductive substance which electrically connects the first honeycomb shape pattern and the second honeycomb shape pattern through the at least one contact hole.

17. The liquid crystal display panel of claim 11, wherein the lower substrate further comprises a first diode including an input terminal and an output terminal that are respectively connected to the first honeycomb shape pattern and the second honeycomb shape pattern.

18. The liquid crystal display panel of claim 12, further comprising:
- a first test line which connects the first pads and the gate driving part;
- a second test line which connects the second pads and a data line which is extended in the third peripheral area which faces the first peripheral area with the display area interposed therebetween; and
- a third test line which connects to the third pad and the signal line.

\* \* \* \* \*